United States Patent
Moschiano et al.

(10) Patent No.: US 7,983,088 B2
(45) Date of Patent: Jul. 19, 2011

(54) PROGRAMMING IN A MEMORY DEVICE

(75) Inventors: Violante Moschiano, Bacoli (IT);
Marco-Domenico Tiburzi, Avezzano (IT); Giovanni Santin, Vazia (IT); Giulio G. Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 12/477,314

(22) Filed: Jun. 3, 2009

(65) Prior Publication Data
US 2010/0157685 A1    Jun. 24, 2010

(30) Foreign Application Priority Data
Dec. 24, 2008  (IT) .............................. RM2008A0693

(51) Int. Cl.
*G11C 11/34* (2006.01)
(52) U.S. Cl. .............................. 365/185.19; 365/185.24
(58) Field of Classification Search ............. 365/185.19, 365/185.24
See application file for complete search history.

(56) References Cited

U.S. PATENT DOCUMENTS

| | | | | |
|---|---|---|---|---|
| RE36,210 E | * | 5/1999 | Santin | 365/185.19 |
| 5,903,499 A | * | 5/1999 | Peng et al. | 365/185.29 |
| 5,940,325 A | * | 8/1999 | Chang et al. | 365/185.28 |
| 5,956,273 A | * | 9/1999 | Lin et al. | 365/185.19 |

FOREIGN PATENT DOCUMENTS

| WO | WO 96/41346 | 12/1996 |
|---|---|---|
| WO | WO 2005/101424 A1 | 10/2005 |
| WO | WO 2008/013619 A2 | 1/2008 |

* cited by examiner

*Primary Examiner* — Michael T Tran
(74) *Attorney, Agent, or Firm* — Leffert Jay & Polglaze, P.A.

(57) ABSTRACT

Methods for programming a memory device, memory devices, and a memory systems are provided. According to at least one such method, a selected memory cell is programmed by a series of programming pulses. The series of programming pulses are configured in sets of programming pulses where each set has the same quantity of pulses and each programming pulse in the set has substantially the same amplitude (i.e., programming voltage). The amplitude of the programming pulses of subsequent sets is increased by a step voltage from the previous amplitude.

22 Claims, 6 Drawing Sheets

US 7,983,088 B2

PROGRAMMING IN A MEMORY DEVICE

RELATED APPLICATION

This application claims priority to Italian Patent Application Serial No. RM2008A000693, filed Dec. 24, 2008, entitled "PROGRAMMING IN A MEMORY DEVICE," which is commonly assigned.

TECHNICAL FIELD OF THE INVENTION

The present invention relates generally to memory devices and in a particular embodiment the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array that includes a large number of memory cells. Each of the memory cells includes a floating gate field-effect transistor capable of holding a charge. The cells are usually grouped into blocks of 64 pages of single level cells (SLC) or 128 pages of multilevel cells (MLC), where each page is typically 2048 bytes of data on 32 word lines. Each of the cells within a block can be electrically programmed on a random basis by charging the floating gate.

The data in a cell is determined by the presence or absence of charge on the floating gate. Each memory cell can be programmed as an SLC or MLC. Each cell's threshold voltage ($V_t$) determines the data that is stored in the cell. For example, in an SLC, a $V_t$ of 0.5V can indicate a programmed cell while a $V_t$ of −0.5V might indicate an erased cell. The multilevel cell has multiple $V_t$ ranges that each indicates a different state. Multilevel cells can take advantage of the analog nature of a traditional flash cell by assigning a bit pattern to a specific voltage distribution for the cell. This technology permits the storage of two or more bits per cell, depending on the quantity of voltage ranges assigned to the cell. The charge can be removed from the floating gate by a block erase operation.

FIG. 1 illustrates a typical prior art $V_t$ distribution diagram where the vertical axis is the quantity of cells and the horizontal axis is the threshold voltage $V_t$. The most negative state 101 is typically referred to as the erased state, has a negative voltage, and is typically represented as a logical "11". The programmed states are typically referred to as logical "01" 102, logical "00" 103, and logical "10" 104 states and are programmed from the erased state 101.

The variations in each $V_t$ distribution width 110 is an important parameter to control during programming. The tightest possible distribution is desired, as shown in FIG. 1, in order to produce greater spacing 115 between each of the states 101-104. This enables easier discrimination between states 101-104 since the possibility of a higher voltage of one distribution overlapping a lower $V_t$ of the next distribution is reduced.

As illustrated in FIG. 2, conventional SLC and MLC programming use incrementally increasing (e.g., ΔV) programming pulses 200 that are applied to the access lines (e.g., word lines) of the memory cell array to achieve discrete levels of $V_t$ for the cells in the array. Between each program pulse, a verify is performed to determine if the cell's target $V_t$ has been achieved. Memory cells that have reached their target $V_t$ are inhibited from further programming during subsequent pulses by biasing of the data line (e.g., bit line).

FIG. 2 shows an initial erased distribution 201 that is moved to a more positive, programmed state by the application of the programming pulses 200 to control gates of the memory cells. The programming pulses start at $V_{start}$ and increment by a step voltage ΔV from the previous pulse. After the first programming pulse, the distribution 202 has moved towards the 0V origin. The third programming pulse has slightly tightened the distribution 203 as well as moved it in a positive direction. The fourth programming pulse has moved and tightened the distribution 204 even further.

It can be seen from FIG. 2 that the width of the distribution is driven by the programming pulse step voltage. If the step voltage is reduced, the final distribution width is reduced. However, there is a point at which reducing the step voltage has no further affect on the distribution width. At this point, a "saturation" of the distribution width has been reached. This saturation area can be different for each memory cell. Thus, even if the program step voltage is ΔV, the final distribution width might be greater than ΔV.

An additional problem with reducing the programming step voltage is the affect on programming throughput. As the step voltage is reduced, the amount of time required to program a memory cell is increased.

For the reasons stated above, and for other reasons stated below which will become apparent to those skilled in the art upon reading and understanding the present specification, there is a need in the art for a way to reduce $V_t$ distribution width without significantly impacting the programming throughput of the memory device.

DETAILED DESCRIPTION

Figure 1:
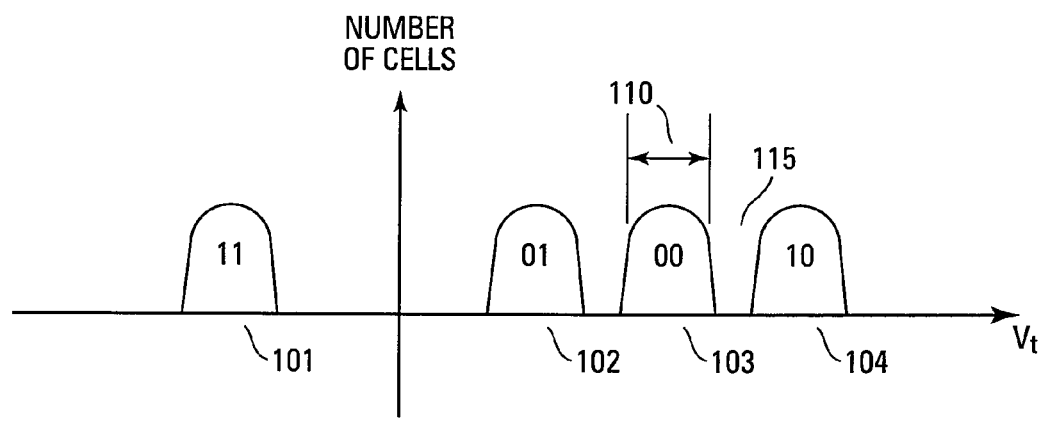
FIG. 1 shows a typical prior art threshold voltage distribution diagram.
Figure 2:
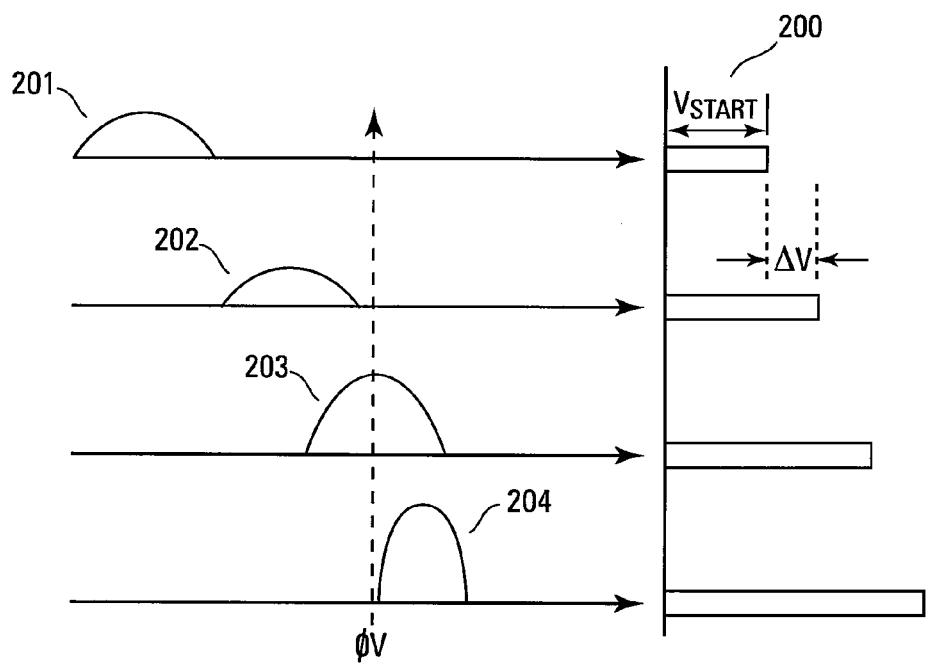
FIG. 2 shows a typical prior art programming pulses and the resulting affect on the threshold voltage distribution.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
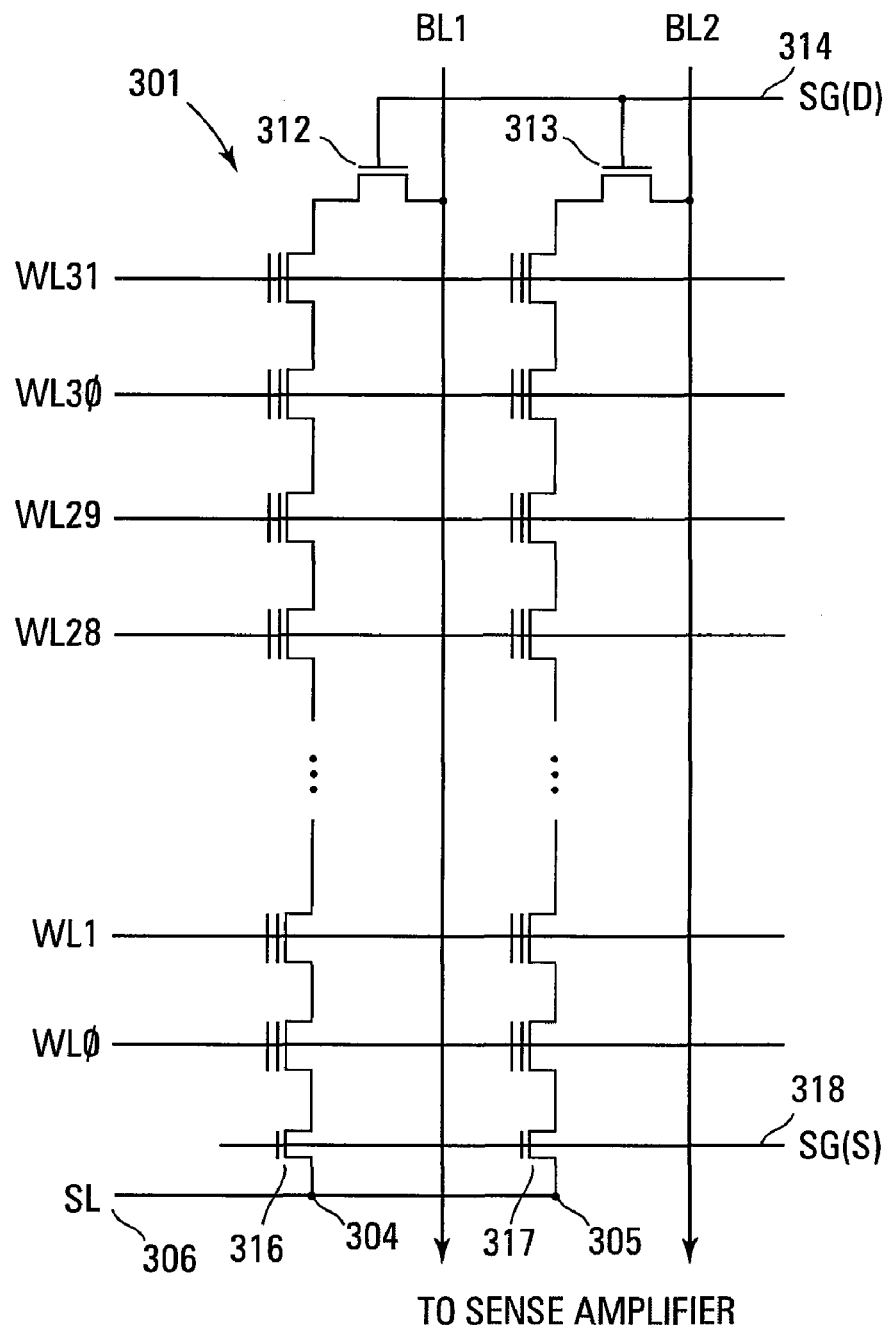
FIG. 3 shows a schematic diagram of one embodiment of a non-volatile memory array.

FIG. 3 illustrates a schematic diagram of a portion of a NAND architecture memory array comprising series strings of non-volatile memory cells on which the embodiments of the subsequently discussed data collection and compression/decompression can operate. While the subsequent discussions refer to a NAND memory device, the present embodiments are not limited to such an architecture but can be used in other memory device architectures as well. For example, alternate embodiment arrays could be organized in NOR or AND architectures.

The memory array is comprised of an array of non-volatile memory cells 301 (e.g., floating gate) arranged in columns such as series strings 304, 305. Each of the cells 301 is coupled drain to source in each series string 304, 305. A word line WL0-WL31 that spans across multiple series strings 304, 305 is connected to the control gates of each memory cell in a row in order to bias the control gates of the memory cells in the row. The bit lines BL1, BL2 are eventually connected to sense amplifiers (not shown) that detect the state of each cell by sensing current on a particular bit line.

Each series string 304, 305 of memory cells is coupled to a source line 306 by a source select gate transistor 316, 317 and to an individual bit line BL1, BL2 by a drain select gate transistor 312, 313. The source select gate transistors 316, 317 are controlled by a source select gate control line SG(S) 318 coupled to their control gates. The drain select gate transistors 312, 313 are controlled by a drain select gate control line SG(D) 314.

The memory array can be organized as memory blocks. The quantity of memory blocks is typically determined by the size of the memory device (i.e., 512 MB, 1 GB). In one embodiment, each memory block programmed in an SLC manner is comprised of 64 pages. In another embodiment, a memory block programmed in an MLC manner is comprised of 128 pages. Each page can be comprised of 2048 bytes of data on 32 word lines.

Figure 4:
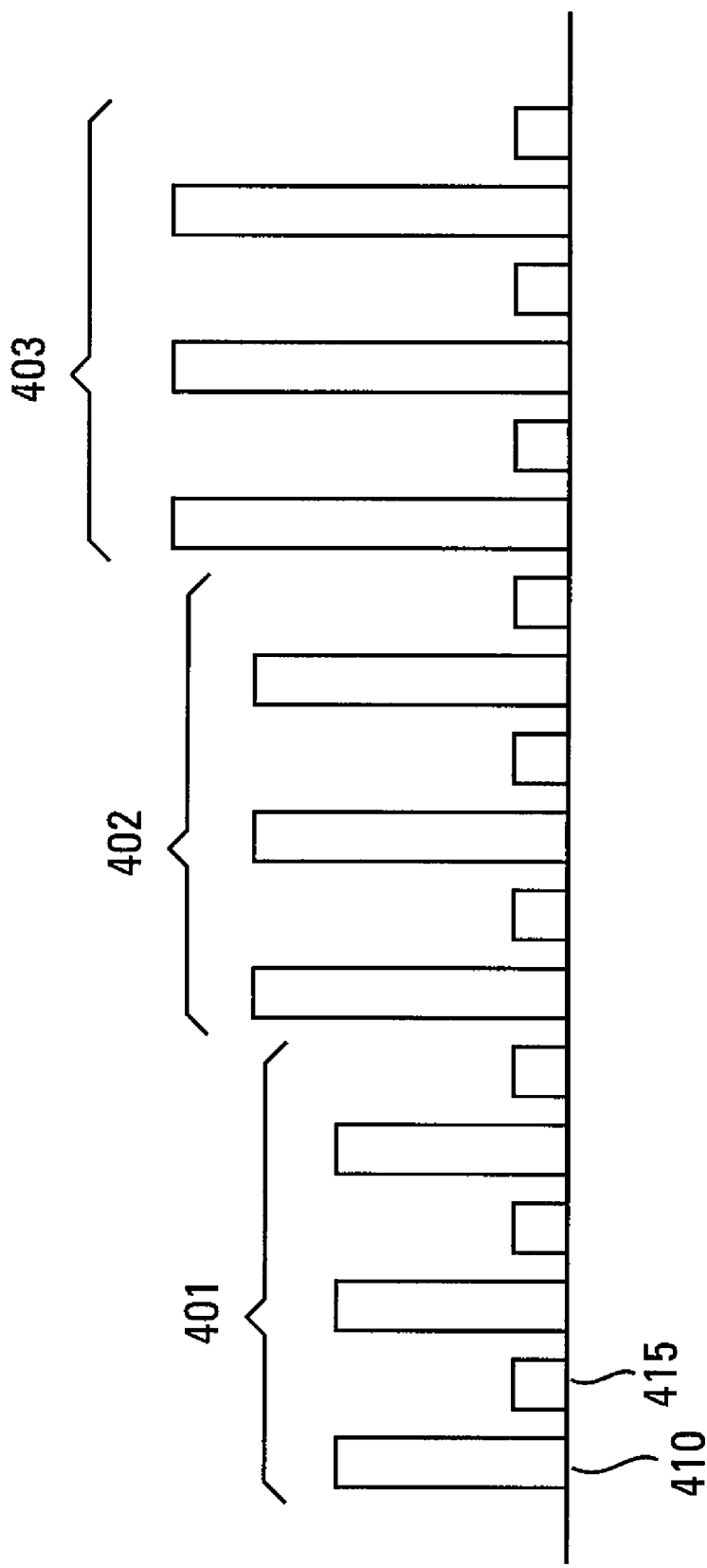
FIG. 4 shows programming and verify pulses for one embodiment of a programming method.
Figure 7:
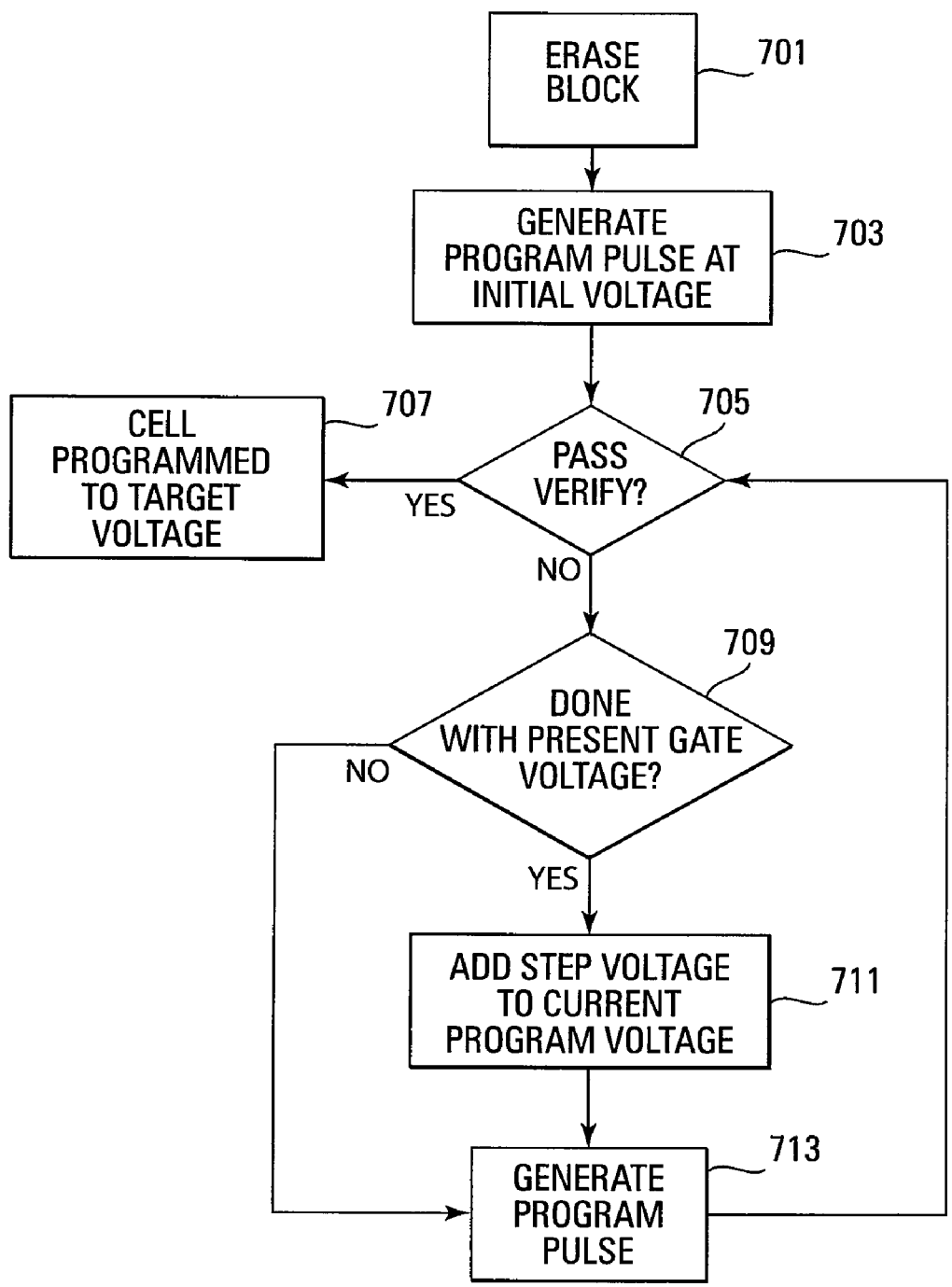
FIG. 7 shows a flowchart of one embodiment of the programming method of the present disclosure.

FIG. 4 illustrates a series of programming and verify pulses in accordance with one embodiment of a method for programming such as the method of FIG. 7. The method is subsequently described as it applies to a memory cell. However, a flash memory device is typically erased and programmed on a memory block-by-memory block basis. Thus the described programming method embodiments can be expanded to program entire memory blocks as well as other groups of memory cells.

The embodiment of FIG. 4 shows both the programming pulse 410 that is applied to the control gates of the memory cells for programming and the subsequent verify pulse 415 that is applied to the control gates of the memory cells for program verification. Instead of increasing each subsequent programming pulse, as is done in the prior art programming operations, the method illustrated in FIG. 4 generates a number of programming pulses at substantially the same control gate voltage (i.e., the amplitude of the programming pulse) before increasing the voltage for the next set of programming pulses.

Using a number of programming pulses at the same program voltage pushes the memory cells into the saturation area more quickly than increasing the program voltage with every pulse. The saturation condition occurs when the threshold voltage ($V_t$) of the memory cell moves, by increasing the gate voltage ($V_g$), according to the cell coupling factor equation $dV_t=K*dV_g$. In other words, the rate of change of the threshold voltage is equal to a constant times the rate of change of the memory cell gate voltage. If programming pulses have a small pulse width, even a large $V_g$ step voltage will not move the threshold voltage of the memory cell as quickly as programming pulses having a larger pulse width.

The slow movement of the threshold voltage does not typically occur if the same gate voltage is used over many pulses, as in the present programming embodiments. The multiple programming pulses with the same gate voltage in each set of programming pulses moves the threshold voltage more quickly to the saturation region. Also, the multiple programming pulses at the same gate voltage provide a threshold voltage that is much closer to one that can be calculated using the coupling factor equation above.

The embodiment of FIG. 4 shows three programming pulses in each set of programming pulses having the same amplitude/$V_g$. This is for purposes of illustration only as the present embodiments are not limited to any one quantity of programming pulses in each set. The quantity of programming pulses in each set is determined experimentally based on the memory technology. For example, a nitride charge storage layer might use a different quantity of programming pulses per set than a polysilicon charge storage layer. Similarly, programming an MLC memory device might required more pulses per set than programming an SLC memory device.

The embodiment of FIG. 4 shows a first set of programming pulses 401 at the initial programming voltage (e.g., 15V). The programming voltage is then increased by the step voltage $\Delta V$ (e.g., 0.2V) to the programming voltage (e.g., $V_g$=15.2V) for the next set of programming pulses 402. Similarly, the programming pulses are increased by the step voltage to the next programming voltage (e.g., $V_g$=15.4V) for the next set of programming pulses. A program verify operation with the verify pulse 415 is performed between each programming pulse in each set of programming pulses. This process is repeated until the memory cell is verified as being programmed or an error condition occurs when the memory cell cannot be verified as programmed.

Figure 6:
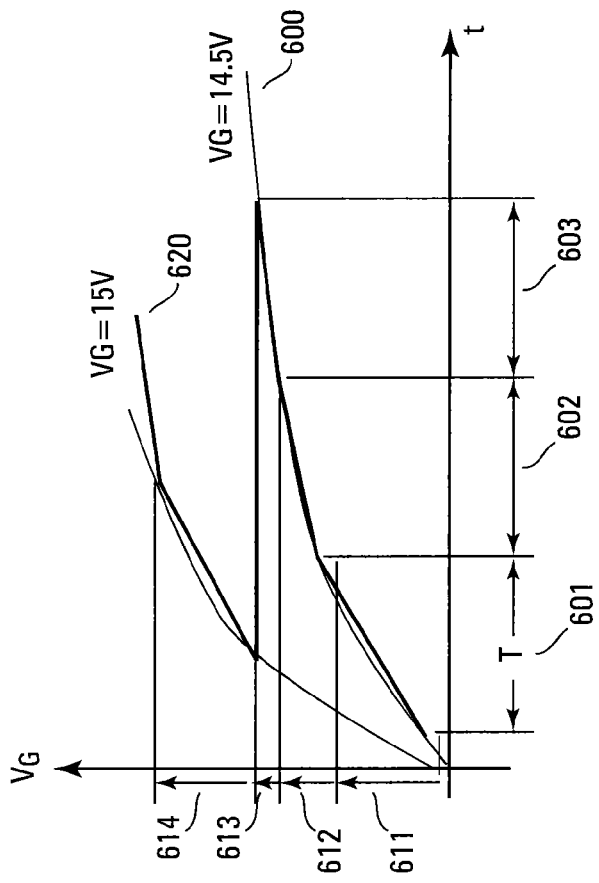
FIG. 6 shows a plot of a control gate voltage during one embodiment of the programming method of the present disclosure.

The verify operation is a form of memory cell read that biases the memory cell control gate with verify pulse at a read voltage that can be within the allocated range of threshold voltages for reading. The read voltage turns on the memory cell and enables the sense circuitry to compare the resulting current on the bit line with a reference current to determine if the memory cell is programmed to the target threshold voltage. If the memory cell has reached the target threshold voltage, the bit line coupled to that memory cell is biased at an inhibit voltage (e.g., $V_{CC}$) to inhibit further programming of that memory cell during the present memory block programming. In the position between two programming pulses of the same voltage, the threshold voltage shift is lower, thus increasing the threshold voltage resolution. This concept is illustrated in FIGS. 5 and 6.

Figure 5:
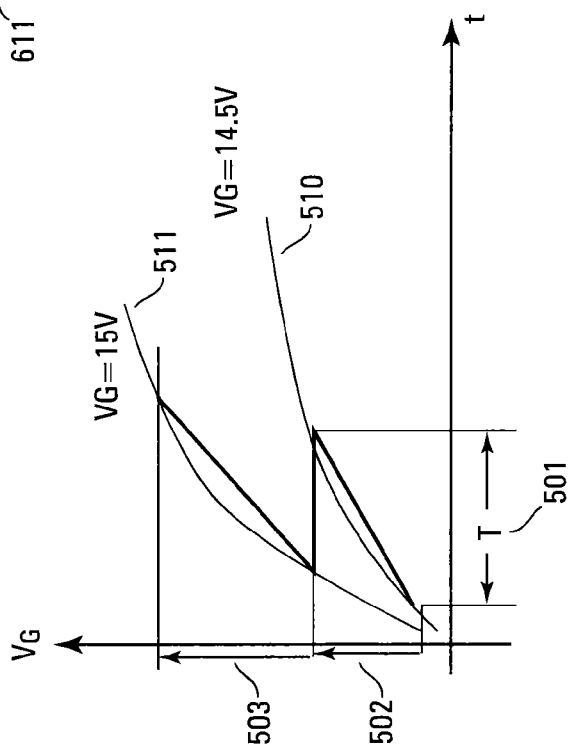
FIG. 5 shows a plot of a control gate voltage during a typical prior art programming operation.

FIG. 5 illustrates a plot of a control gate voltage during a typical prior art programming operation. This plot shows a curve 510 for when the programming pulse has an amplitude of 14.5V (i.e., $V_g$=14.5V) and another curve 511 for when the programming pulse has an amplitude of 15.0V. Each programming pulse has a pulse width of time T 501.

During the illustrated programming operation, an initial programming pulse at 14.5V results in the increase along the 14.5V curve as shown by the vertical increase 502. A step voltage of 0.5V is added to the initial 14.5V resulting in the second pulse having an amplitude of 15.0V. This second pulse, having the T pulse width, results in the increase along the 15V curve 511 as shown by the second vertical increase 503.

FIG. 5 shows the large increases 502, 503 resulting from two programming pulses of the prior art programming method. Such large increases can result in over-programming of a memory cell if its target threshold voltage is, for example, somewhere along the 15V curve between the end of the first programming pulse and the end of the second programming pulse. Such a programming operation would also result in a much wider threshold voltage distribution for the target state due to the inability to the large increases from one programming pulse to the next.

FIG. 6 illustrates a plot of a control gate voltage as a result of the embodiments of the present programming method. This plot shows the same 14.5V Vg curve 600 and the 15V curve 620 as in the prior art method of FIG. 5. However, each programming pulse of width T 601-603 and amplitude 14.5V results in much smaller vertical increases 611-613 along the 14.5V curve. When the programming voltage is increased with a step voltage of 0.5V from 14.5V to 15V, the movement along the 15V curve 620 also indicates a short vertical increase 614. Thus, the embodiments of the present programming method would generate substantially narrower threshold voltage distributions as a result of these reduced increases.

FIG. 7 illustrates a flow chart of one embodiment of the method for programming a memory device. Since flash memory cells are programmed from an erased state on a block-by-block basis, the first step is an erase operation on the erase block 701. However, if a programming embodiment is performed on a different technology not requiring an erased state, the erase operation 701 is not required.

The programming pulses at the initial programming voltage (e.g., 15V) are generated 703. As discussed previously, the programming voltage is the voltage used to bias the control gate of the memory cell or cells being programmed and is typically applied to a selected word line that couples the row of memory cells being programmed.

A verify operation is then performed 705 to determine if the memory cell or cells being programmed have reached their respective target threshold voltage. The memory cells that have been programmed to their respective target threshold voltage 707 are inhibited from further programming during this operation by bit line biasing or some other inhibit method.

If the memory cells being programmed have not reached their respective target threshold voltage, it is determined if all of the programming pulses in the present set of programming pulses have been applied 709. If not all of the programming pulses in a particular set of programming pulses have been applied, another programming pulse having the same amplitude as the previous pulse is generated 713 to bias the selected word line after which a verify operation is again performed 705.

If all of the predetermined quantity of programming pulses for a particular amplitude has been generated 709 and the memory cells being programmed have not reached their respective target threshold voltage, a step voltage is added to the current program voltage 711 and another programming pulse at the new voltage is generated 713. This process is repeated until the memory cells are programmed or an error condition occurs when the selected memory cells cannot be programmed.

Figure 8:
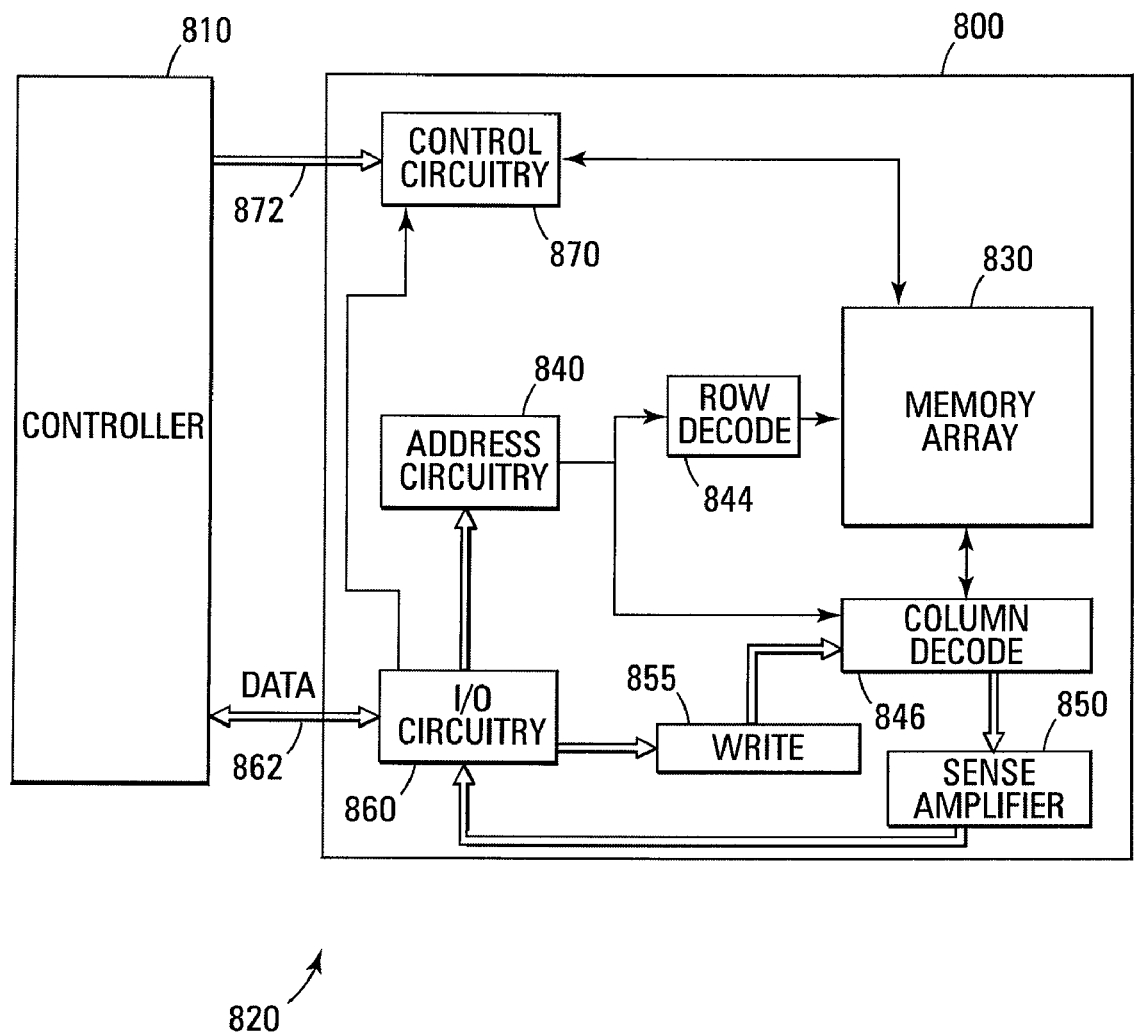
FIG. 8 shows a simplified block diagram of one embodiment of a memory system of the present invention.

FIG. 8 illustrates a functional block diagram of a memory system 820 that includes a memory device 800. The memory device 800 has been simplified to focus on features of the memory that are helpful in understanding the present embodiments for memory programming. The memory device 800 is coupled to a system controller 810. The controller 810 may be a microprocessor or some other type of controller.

The memory device 800 includes an array 830 of non-volatile memory cells, such as the series strings illustrated in FIG. 3 and discussed previously. The memory array 830 is arranged in banks of word line rows and bit line columns. In one embodiment, the columns of the memory array 830 are comprised of series strings of memory cells. As is well known in the art, the connections of the cells to the bit lines determines whether the array is a NAND architecture, an AND architecture, or a NOR architecture.

Address buffer circuitry 840 is provided to latch address signals provided through the I/O circuitry 860. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense amplifier circuitry 850. The sense amplifier circuitry 850, in one embodiment, is coupled to read and latch a row of data from the memory array 830. I/O circuitry 860 is included for bidirectional data communication as well as address communication over a plurality of data connections 862 with the controller 810. Write circuitry 855 is provided to program data to the memory array 830.

Memory control circuitry 870 decodes signals provided on control connections 872 from the controller 810. These signals are used to control the operations on the memory array 830, including data read, data write (program), and erase operations. The memory control circuitry 870 may be a state machine, a sequencer, or some other type of control circuitry to generate the memory control signals. In one embodiment, the memory control circuitry 870 is configured to transfer data to the memory array 830 for execution of the programming embodiments discussed previously. The memory control circuitry 870 is further configured to read data from the memory array 830.

The memory device illustrated in FIG. 8 has been simplified to facilitate a basic understanding of the features of the memory. A more detailed understanding of internal circuitry and functions of flash memories are known to those skilled in the art.

CONCLUSION

In summary, one or more embodiments of the present invention provide a method for programming, such as solid state memory devices, in order to produce narrow $V_t$ distributions without greatly impacting programming speed. For example, this can be accomplished by biasing control gates of selected memory cells (e.g., through word lines) with sets of programming pulses where each pulse in the set of programming pulses has the same amplitude. Subsequent sets of programming pulses are generated by adding a step voltage $\Delta V$ to the current voltage. This is repeated until the target memory cells are programmed to their respective target threshold voltages.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory cell, the method comprising:
   applying a plurality of programming pulses to the memory cell wherein the plurality of programming pulses comprises a plurality of sets of programming pulses wherein all of the programming pulses in a respective one of the sets are substantially equal in both width and amplitude and at least one of the sets has a different amplitude from at least another one of the sets; and
   determining if the memory cell has reached a positive, target threshold voltage between each of the plurality of programming pulses;
   wherein the plurality of programming pulses move a threshold voltage of the memory cell from a negative threshold voltage to the positive, target threshold voltage.

2. The method of claim 1 and further including initially erasing the memory cell.

3. The method of claim 2 wherein erasing the memory cell comprises causing the memory cell to have a negative threshold voltage.

4. The method of claim 1 wherein determining if the memory cell has reached a target threshold voltage comprises applying a verify pulse having a read voltage to the memory cell.

5. The method of claim 4 wherein the read voltage is within an allocated range of threshold voltages for reading.

6. The method of claim 1 wherein each subsequent set of programming pulses has a greater programming pulse amplitude than a previous set.

7. The method of claim 6 wherein an amplitude of the programming pulses of each respective one of the subsequent sets is greater than the amplitude of the previous set of programming pulses by a step voltage.

8. The method of claim 1 and further comprising determining a quantity of programming pulses in each set of programming pulses in response to a type of memory cell.

9. A method for programming a plurality of memory cells, the method comprising:
   applying a first plurality of programming pulses to selected memory cells of the plurality of memory cells, the first plurality of programming pulses all having a first programming voltage and particular pulse width; and
   determining if the selected memory cells have each reached a respective positive, target threshold voltage between each of the first plurality of programming pulses;
   wherein the first plurality of programming pulses move a threshold voltage of a selected one of the plurality of memory cells from a negative threshold voltage to its respective positive, target threshold voltage.

10. The method of claim 9 and further including:
    applying a second plurality of programming pulses to those selected memory cells that have not reached their respective target threshold voltage, wherein the second plurality of programming pulses all have the particular pulse width and a second programming voltage that is greater than the first programming voltage; and
    determining if the selected memory cells have each reached their respective target threshold voltage between each of the second plurality of programming pulses.

11. The method of claim 10 and further including applying additional pluralities of programming pulses, and determining if the selected memory cells have reached their respective target threshold voltage between each programming pulse, to those selected memory cells that have not reached their respective target threshold voltages wherein each of the additional pluralities of programming pulses have greater programming voltages than a previous plurality of programming pulses and all programming pulses within each plurality of programming pulses have substantially the particular pulse width and the same programming voltage.

12. The method of claim 11 wherein the second programming voltage is substantially equal to the first programming voltage plus a step voltage and the programming voltage of each subsequent plurality of programming pulses is greater than the programming voltage of the previous plurality of programming pulses by the step voltage.

13. The method of claim 9 wherein each programming pulse is applied to at least one access line coupled to the selected memory cells.

14. A method for programming a memory device, the method comprising:
    erasing a selected memory block having a plurality of access lines with a plurality of memory cells coupled to each access line;
    applying at least one programming pulse of a set of a predetermined quantity of programming pulses to a selected access line of the plurality of access lines, the set of the predetermined quantity of programming pulses having a first programming voltage and substantially a same pulse width wherein the at least one programming pulse moves a threshold voltage of a selected memory cell from a negative threshold voltage to a positive, target threshold voltage;
    performing a program verify operation on the selected access line after each programming pulse;
    applying additional programming pulses to the selected access line if the program verify operation indicates a memory cell coupled to the selected access line is not programmed to a target threshold voltage, wherein the additional programming pulses are comprised of additional sets of programming pulses, each set of programming pulses comprising the predetermined quantity of programming pulses and each programming pulse in a set of programming pulses having substantially the same programming voltage and substantially the same pulse width.

15. The method of claim 14 wherein a data line coupled to programmed memory cells that pass the program verify operation is biased to inhibit further programming of the programmed memory cells.

16. The method of claim 14 wherein the programming voltage of the other set is greater than the first voltage by a step voltage.

17. The method of claim 14 wherein the first programming voltage is a control gate voltage that is applied to each control gate of selected memory cells coupled to the selected access line.

18. A memory device comprising:
    a memory array comprising a plurality of non-volatile memory cells; and
    control circuitry coupled to the memory array and configured to control operation of the memory array, the control circuitry further configured to control generation of a plurality of sets of programming pulses wherein each set of programming pulses comprises a same predetermined plurality of programming pulses and each programming pulse in a respective one of the sets is generated at a substantially equal amplitude and a substantially equal pulse width as the other programming pulses in the respective set wherein the plurality of sets of programming pulses are configured to move a threshold voltage of a selected non-volatile memory cell of the plurality of non-volatile memory cells from a negative threshold voltage to a positive, target threshold voltage.

19. The memory device of claim 18 wherein the memory array is comprised of a NAND architecture of flash memory cells.

20. A memory system comprising:
a controller configured to control operation of the memory system; and
a non-volatile memory device, coupled to the controller, that operates in response to the controller, the non-volatile memory device comprising:
a memory array comprising a plurality of memory cells; and
control circuitry coupled to the memory array and configured to control programming of the memory array wherein the control circuitry is configured to control generation of a plurality of sets of programming pulses, each programming pulse having a programming voltage, wherein each set comprises a plurality of programming pulses and each programming pulse in a set has substantially the same pulse width and substantially the same programming voltage that is different from the programming voltages of the other sets of programming pulses wherein the plurality of programming pulses are configured to move a threshold voltage of a selected memory cell of the plurality of memory cells from a negative threshold voltage to a positive, target threshold voltage.

21. The memory system of claim 20 wherein the control circuitry is further configured to control bias of a data line with a voltage that either slows or inhibits programming of a target memory cell in response to a threshold voltage of the target memory cell being reached.

22. The memory system of claim 20 wherein the control circuitry is further configured to control generation of verify pulses between each of the programming pulses.

* * * * *